(12) United States Patent
Zomagbouelou et al.

(10) Patent No.: US 10,938,393 B2
(45) Date of Patent: Mar. 2, 2021

(54) FREQUENCY SWEEP GENERATOR AND METHOD

(71) Applicant: Stichting IMEC Nederland, Eindhoven (NL)

(72) Inventors: Wilfried Zomagbouelou, Eindhoven (NL); Paul Mateman, Millingen (NL); Yao-Hong Liu, Eindhoven (NL)

(73) Assignee: Stichting IMEC Nederland, Eindhoven (NL)

( * ) Notice: Subject to any disclaimer, the term of this patent is extended or adjusted under 35 U.S.C. 154(b) by 0 days.

(21) Appl. No.: 16/709,604

(22) Filed: Dec. 10, 2019

(65) Prior Publication Data

US 2020/0195253 A1     Jun. 18, 2020

(30) Foreign Application Priority Data

Dec. 13, 2018 (EP) .................................... 18212410

(51) Int. Cl.
| | |
|---|---|
| *H03L 7/04* | (2006.01) |
| *H03B 5/12* | (2006.01) |
| *H03B 5/24* | (2006.01) |
| *H03B 23/00* | (2006.01) |
| *G01S 13/34* | (2006.01) |
| *H03C 3/00* | (2006.01) |

(52) U.S. Cl.
CPC ................ *H03L 7/04* (2013.01); *G01S 13/34* (2013.01); *H03B 5/1265* (2013.01); *H03B 5/24* (2013.01); *H03B 23/00* (2013.01); *H03C 3/00* (2013.01)

(58) Field of Classification Search
CPC ........................ H03B 5/1265; H03B 2200/005; H03B 23/00; H03K 3/0315; H03K 3/0322; H03K 3/0231; H03K 3/354; H03C 3/00; H03C 3/145; G01S 7/35; G01S 13/34; H01S 13/343
See application file for complete search history.

(56) References Cited

U.S. PATENT DOCUMENTS

| | | |
|---|---|---|
| 6,094,105 A | 7/2000 | Williamson |
| 6,885,331 B2 | 4/2005 | Krymski |
| | (Continued) | |

OTHER PUBLICATIONS

European Search Report, European Patent Application No. 18212410. 7, dated Apr. 4, 2019, 10 pages.

(Continued)

*Primary Examiner* — Ryan Johnson
(74) *Attorney, Agent, or Firm* — McDonnell Boehnen Hulbert & Berghoff LLP

(57) ABSTRACT

An oscillator is configured to generate a signal with a frequency sweep, the oscillator having circuitry comprising a set of capacitors, each capacitor of the set of capacitors being switchably connectable in parallel in the circuitry so that the frequency of the signal has an intrinsic dependence on the number of the capacitors connected, a shift register controllable by a clock line and comprising a number of bits, each bit of the number of bits controlling connection of a respective capacitor of the set of capacitors so that the capacitors are connectable or disconnectable in a pre-determined order by shifting, respectively, activation or de-activation bits into the shift register, wherein the shifting is paced by the clock line; and a clock signal generator configured to output a clock signal with a time modulation on the clock line.

14 Claims, 3 Drawing Sheets

(56) References Cited

U.S. PATENT DOCUMENTS

| | | | |
|---|---|---|---|
| 7,330,081 B1 | 2/2008 | Asa et al. | |
| 8,212,610 B2 | 7/2012 | Bereza et al. | |
| 8,981,858 B1 * | 3/2015 | Wright | H03K 3/84 |
| | | | 331/111 |
| 9,628,057 B2 * | 4/2017 | Shuvalov | H03K 3/0231 |
| 10,439,555 B2 * | 10/2019 | Saric | H03B 5/1243 |
| 2008/0100350 A1 * | 5/2008 | Pernia | H03B 5/1243 |
| | | | 327/114 |
| 2010/0073054 A1 | 3/2010 | Bereza et al. | |

OTHER PUBLICATIONS

Jeon, Heungjun et al., "A Novel 4-to-3 Step-Down On-Chip SC DC—DC Converter With Reduced Bottom-Plate Loss", 2012 IEEE 55th International Midwest Symposium on Circuits and Systems (MWSCAS). IEEE, 2012, .pp. 1060-1063.

Kim, Se-Young et al., "Wideband Linear Frequency Modulated Waveform Compensation Using System Predistortion and Phase Coefficients Extraction Method", IEEE Microwave and Wireless Components Letters, vol. 17, No. 11, Nov. 2007, pp. 808-810.

* cited by examiner

FREQUENCY SWEEP GENERATOR AND METHOD

CROSS-REFERENCE TO RELATED APPLICATIONS

The present application is a non-provisional patent application claiming priority to European Patent Application No. EP 18212410.7, filed Dec. 13, 2018, the contents of which are hereby incorporated by reference.

FIELD OF THE DISCLOSURE

The present disclosure relates to an oscillator configured to generate a signal with a frequency sweep. Further, the present disclosure relates to a method of generating a signal with a frequency sweep.

BACKGROUND

Oscillators generating a frequency sweep are, for example, useful for biomedical applications, such as biomedical radar systems. This may require a fine resolution, circuit area efficiency, low power, and wideband linear frequency modulation with high speed.

Such oscillators may for example be digitally controlled oscillators (DCOs) having switchable capacitors. To achieve a desired resolution performance, a large number of capacitors may be used, the complexity of addressing which is often handled through row-column decoding. In a typical case of linear frequency ramping, non-linearities, for example due to the inverse square-root dependence of the frequency on the capacitance is usually handled through pre-distortion in the frequency domain.

S. K. Kim and N. H. Myung, "Wideband linear frequency modulated waveform compensation using system predistortion and phase coefficients extraction method" IEEE Microwave. Wireless. Components letter, vol 17, no, 11, pp. 808-810, 2007, discloses such an oscillator.

SUMMARY

Embodiments of the present disclosure provide an oscillator configured to generate a frequency sweep with high accuracy with respect to a desired time profile of the frequency sweep while retaining low circuit complexity. Additionally or alternatively, some embodiments provide an oscillator configured to generate a frequency sweep with a high degree of linearity.

According to an aspect of the present disclosure, there is provided an oscillator configured to generate a signal with a frequency sweep, the oscillator having circuitry comprising a set of capacitors, each capacitor of the set of capacitors being switchably connectable in parallel in the circuitry so that the frequency of the signal has an intrinsic dependence on the number of the capacitors connected, a shift register controllable by a clock line and comprising a number of bits, each bit of the number of bits controlling connection of a respective capacitor of the set of capacitors so that the capacitors are connectable or disconnectable in a pre-determined order by shifting, respectively, activation or de-activation bits into the shift register, wherein the shifting is paced by the clock line; and a clock signal generator configured to output a clock signal with a time modulation on the clock line.

The oscillator may for example be a ring oscillator, a Gm oscillator or an inductor-capacitor oscillator (LC oscillator), but the present disclosure is applicable to any oscillator circuit arrangement where frequency of the signal has an intrinsic dependence on the number of the capacitors connected in parallel.

The bits comprised in the shift register may typically be input into the shift register using a data line. Upon an activation signal on the clock line, which for example may be a leading edge of the clock signal, the signal on the data line is stored in the first bit of the shift register, while the bit previously stored there is moved to the second bit, and so on. If, for example, the shift register starts in a state with all deactivation bits (typically "0" bits), meaning that no capacitors are connected in the circuit, an activation bit (typically a "1" bit) may be shifted into the first bit of the shift register upon activation of the clock signal, switching the corresponding capacitor into the circuit, simultaneously changing the oscillator frequency. Upon the next leading edge of the clock signal, another one bit may be shifted into the shift register, so that the first two bits now are activation bits, while the rest of the bits are deactivation bits, further changing the frequency of the oscillator, and so on. Thus, pacing of this shifting, i.e., the time between the shifts in frequency, is controlled by the clock line. This typically leads to a frequency sweep towards decreasing frequency.

In another embodiment, the shift register may start in a state with all activation bits, meaning that all capacitors of the set of capacitors are connected in the circuit. Deactivation bits may then successively shift into the shift register, typically leading to a frequency sweep towards increasing frequency.

Generally, the intrinsic dependence of the frequency of the oscillator on the number of connected capacitors is non-linear. For example, for an LC oscillator, the frequency of the oscillator will have a frequency inversely proportional to the square root of the total capacitance of the LC circuit, meaning that if capacitors of equal amount are shifted into the shift register with a regular pace, the resulting frequency sweep will reflect the same non-linearity as a function of time.

In the general case, the oscillator may be configured to generate the frequency sweep with a specific time dependence, the time modulation being based on the specific time dependence of the frequency sweep in relation to the intrinsic dependence of the frequency of the signal on the number of capacitors connected, so that the oscillator generates the frequency sweep with the specific time dependence. In other words, the time modulation may be adjusted based on the time profile of a desired frequency sweep, so that the oscillator generates the frequency sweep with that desired time dependence. However, typically, the desired time dependence of the frequency sweep is a linear ramp and the time modulation of the clock signal will serve to compensate for any non-linearities relative to this linear ramp.

By time-modulating the clock signal controlling the shift register, (i.e., allowing it to have a varying time between activation signals on the clock line, such as a gradually increasing or decreasing clock frequency) a desired oscillator frequency sweep may be achieved while at the same time allowing for a relatively low circuit complexity, as two control lines—the data line and the control line—are utilized. This also decreases parasitic capacitance. Further, pre-distortion algorithms and associated power-consuming extra dedicated hardware and data processing algorithms may not be needed and the oscillator is well suited for fast frequency ramping.

In example embodiments a fine resolution wideband DCO may utilize a number of bits according to the frequency modulation range. For instance, a 1 GHz frequency modulation range with fine resolution of 1 MHz may require 1024 switches capacitor to control. The complexity of the control wire increases when the frequency modulation range increases. This result mainly in design complexity and an important drop of the total performance of the system. This could be mitigated by implementing such system with a line-column decoder, to reduce the complexity of the wire control system. For instance, to control 1024 switch capacitors, a combination of 32 lines×32 columns could be used. This may reduce the number of wires utilized to control all 1024 switches capacitors.

However, such approaches show some limitations: The row-column decoding control wire is slow, so that a glitch is usually observed when shift from one row to another row. Moreover, the row-column decoding results in an important increase of the active area. Moreover, the silicon area occupied by the decoding scheme increases when the number of bits increase. For instance, in applications where 1024 or 512 capacitors are used, the row-column decoder used would be respectively equivalent to 64 wires and 48 wires control, with the effect of an important increase of the parasitic capacitance and consequent increase in power consumption and decreases of performance. These drawbacks are avoided by using a shift register according to the present disclosure, which allows for a small area design with fast ramping generation.

Further, to compensate for non-linearity, such as square root LC non-linearity, of the frequency generator, a pre-distortion in frequency domain could be implemented. However, this would result in a considerable increase of complexity of the system. Moreover, the square root LC compensation in frequency domain is not scalable to other technologies. These drawbacks are avoided by using a time-domain non-linearity compensation according to the present disclosure, which allows for a portable and scalable ramping generator design.

According to one embodiment, the switch register is embedded within a tank circuit of the LC oscillator, which further reduces parasitic capacitance, as fewer control lines lead into the tank.

According to another aspect of the present disclosure, a method of generating a signal with a frequency sweep, the method comprising: shifting activation or de-activation bits into a shift register, the shift register comprising a number of bits, each bit of the number of bits controlling connection of a respective capacitor of a set of capacitors in parallel in circuitry of an oscillator, the capacitors being connected or disconnected in a pre-determined order by the shifting of the activation or deactivation bits, the frequency of the signal having an intrinsic dependence on the number of the capacitors connected, wherein the shifting is paced by a clock signal having a time modulation.

This aspect may generally present the same or corresponding features as the former aspect.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
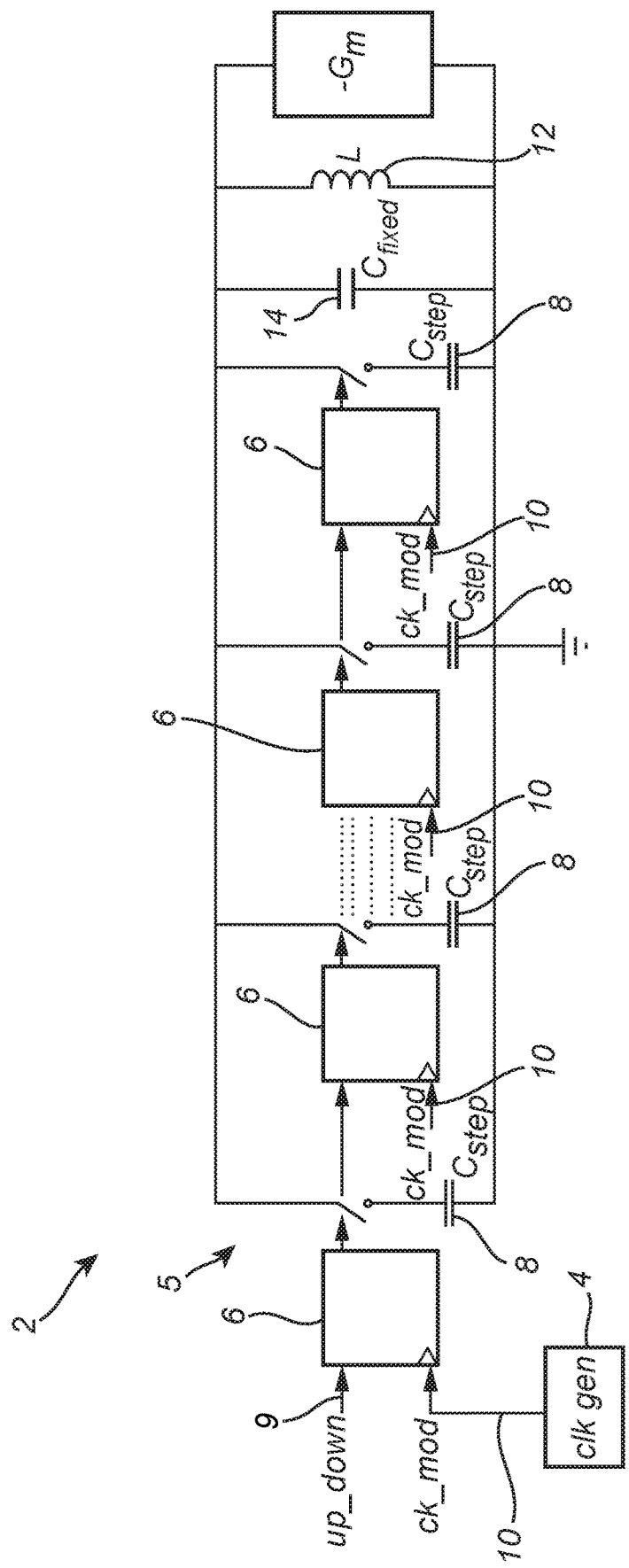
FIG. 1 is a schematic of a tank circuit of an oscillator with an embedded switch register, the clock signal of which is controlled by a clock signal generator.

FIG. 1 illustrates a DCO circuit 2. The DCO circuit 2 comprises an embedded shift register 5 and a clock signal generator 4 as part of an oscillator configured to generate a frequency sweep. Each bit 6 of the shift register controls a respective capacitor 8 connectable in parallel to each other. Thus, the capacitors 8 form a set of capacitors, where each capacitor 8 of the set of capacitors is switchably connectable in parallel in the circuitry 2 of the oscillator. Typically, all capacitors 6 have the same capacitance $C_{step}$. The switching may for example occur through transistors, such as MOSFET transistors. The capacitors 6 are connected in parallel to an inductor 12. In this specific embodiment, the frequency of the oscillator will depend on the inductance L of the inductor 12 and on the combined capacitance of the capacitors 6 and any fixed capacitance $C_{fixed}$ represented by a capacitor 14, including any parasitic capacitance and/or inductance. Thus, the frequency of the generated signal has an intrinsic dependence on the number of capacitors 6 connected. However, the specific oscillator configuration illustrated in FIG. 1 is not the only possibility. Rather, use of a shift register controlled by a time-modulated clock signal is applicable to any oscillator circuitry where the generated frequency depends on circuit capacitance.

The shift register is thus embedded in the DCO circuit 2. This allows one to have the number of control wires independent of the number of switch capacitors 6. Compared to a line-column decoder setup, the number of wires used to control the DCO circuit 2 is reduced to 2, independent of the number of switch capacitors implemented. Reducing the number of control wires allow to reduce the total active area, thus the total parasitic capacitance of the DCO circuit 2 and consequently the power consumption of the DCO circuit 2.

The output of each bit 6 controls the switching of the respective capacitor 8 and is connected to the input of the next bit 6. The input 9 of the first bit 6, marked "up_down", is used for shifting bits into the switch register, while the same clock signal line 10, marked "ck_mod", is connected to all bits 6 of the shift register. Thus, the capacitors are connectable or disconnectable in a pre-determined order by shifting, respectively, activation bits or de-activation bits into the shift register. The "up_down" line allows one to pass "up-ramping" or "down-ramping" ("0" or "1") bits into the shift register controlling the switch capacitor 6. This will result in, respectively, an increase or decrease of the oscillator frequency. "ck_mod" is the clock signal which defines the slope of the frequency modulation.

A clock signal generator 4 is connected to the clock signal line 10 "ck_mod". It is configured to output a time-modulated clock signal. The clock signal generator 4 may be implemented using a clock and a counter, such that the period counted by the counter, and thus the period of the output clock signal, follows a programmed polynomial, as will be explained in the following.

Figure 2A:
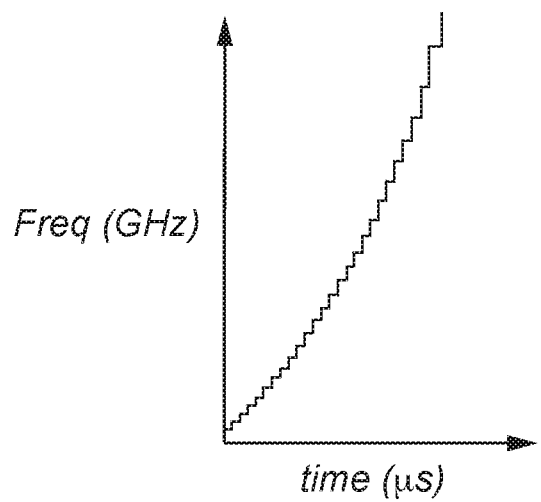
FIG. 2a shows the frequency sweep of the oscillator when not corrected for non-linearity.

FIG. 2a shows the oscillator frequency as a function of time for the oscillator 2 of FIG. 1, where, in this example, deactivation bits are shifted into the shift register 5 at regularly spaced intervals in time, as controlled by the clock line 10. Accordingly, the oscillator frequency exhibits a stepping behavior at regular time intervals, reflecting a successive connection of capacitors. Due to the non-linear dependence of the oscillator frequency on the number of connected capacitors 6, the frequency sweep as a function of time will be non-linear as well, giving the result that the frequency step is different for each additional capacitor connected, due to the inverse square root LC dependence of the oscillator frequency.

Figure 2B:
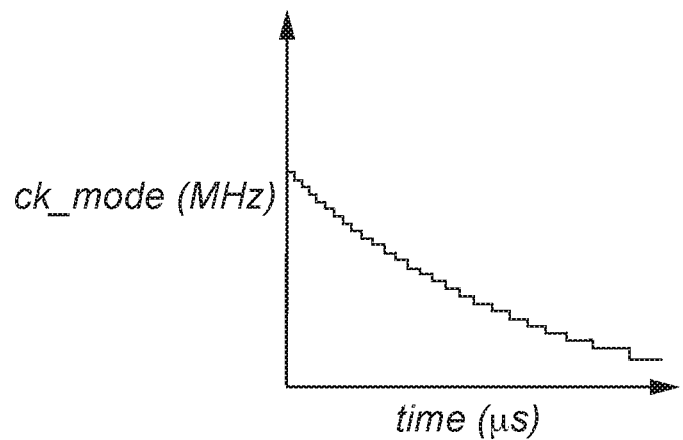
FIG. 2b shows the inverse of the time between two clock signal leading edges as a function of time for a time-modulated clock signal compensating for non-linearity.

FIG. 2b shows a time domain compensation which allows to compensate the frequency non-linearity of the oscillator during a frequency sweep, whereby a time-modulated clock signal 10 "ck_mod" is generated and output by the clock generator 4. This time-modulated signal has a frequency variation as a function of time that compensates for the non-linearity of the oscillator 2. This allows one to compensate for the inverse square root LC non-linearity of the oscillator. In other words, the frequency of the "ck_mod" clock is adjusted during a frequency sweep based on the profile of the signal which is to be linearized. FIG. 2b shows an example of the clock frequency, i.e., inverse of the time between two consecutive leading edges of the clock signal 10, as a function of time. To compensate for the non-linearity of the oscillator frequency (cf. FIG. 2a) the clock frequency decreases as a function of time during a frequency sweep, corresponding to increasing time between each clock signal 10 leading edge.

Given a desired frequency sweep, in this case a linear function of time, and the intrinsic dependence of the oscillator frequency on the number of connected capacitors 6 (cf. FIG. 1), determining the time between pulses on the clock signal 10 may be calculated. For example, in a linear ramp between frequencies $f_A$ and $f_B$ from time t=0 to time t=T, the oscillator frequency $f_t$ at time t can be written $$f_t = f_A + \frac{t}{T}(f_B - f_A) \quad (1)$$

Solving for time t, one gets $$t = \frac{T(f_A - f_t)}{f_A - f_B} \quad (2)$$

The oscillator frequency depends on the number n connected capacitors as follows:

$$f_n = \frac{1}{2\pi\sqrt{L(C_{fixed} + n\, C_{step})}} \quad (3)$$

To find pulse times, one may substitute $f_n$ of equation 3 for $f_t$ in equation 2. The resulting formula may be approximated by a polynomial, reducing hardware complexity, and allowing for a fast, flexible, and low-power clock signal generator.

Figure 2C:
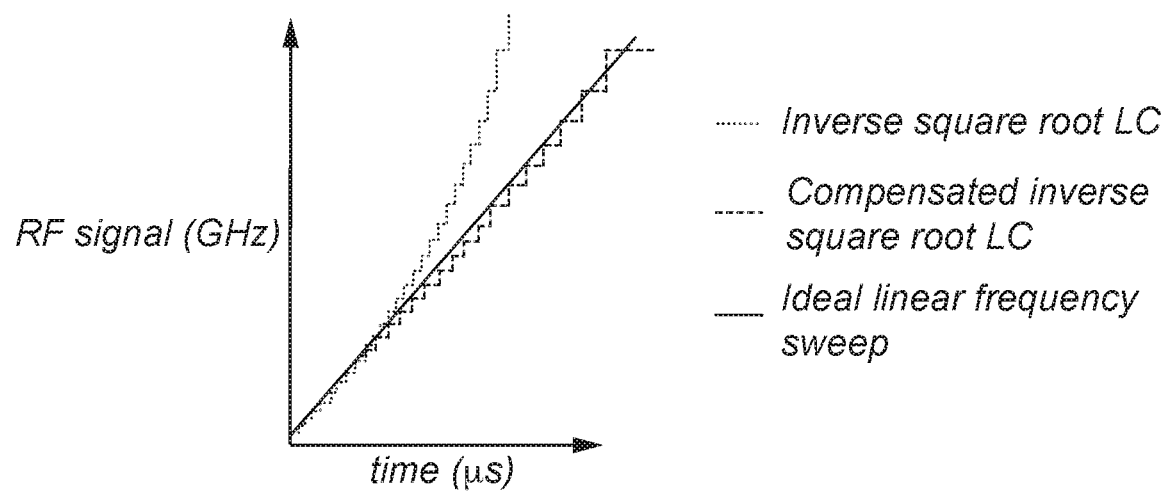
FIG. 2c shows the non-linear profile of FIG. 2a, the linearized signal using the time-modulated clock signal of FIG. 2b, and the resulting frequency sweep compared to an ideal linear ramp.

FIG. 2c shows with a dashed line the oscillator frequency as a function of time when the clock signal of FIG. 2b is applied to the shift register 5. The non-linearity of FIG. 2a (shown with a dotted line for comparison) is compensated for, within the resolution provided by the step-wise connection of the capacitors 6, with sufficient accuracy approximating a linear sweep shown with a solid line. This a time domain compensation allows to have a scalable and portable system which can compensate for frequency non-linearity, such as square root LC non-linearity.

Figure 3:
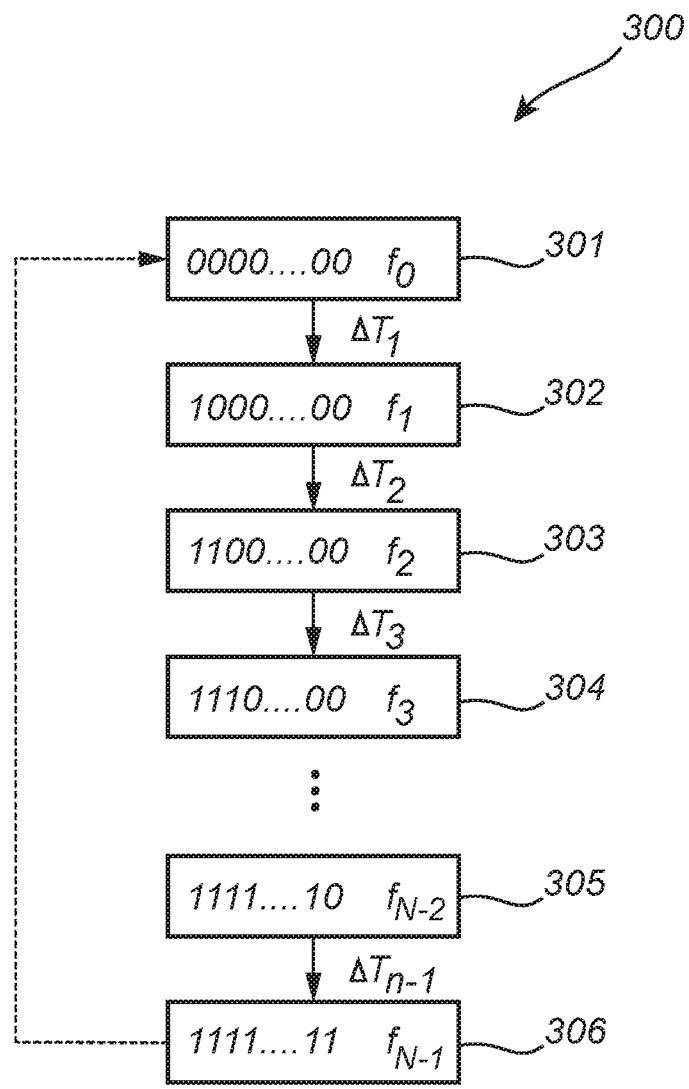
FIG. 3 shows a typical procedure for generating a frequency sweep.

FIG. 3 shows a typical procedure 300 for generating a frequency sweep. Each block shows the N bits of the shift register and the oscillator frequency. The procedure may for example be implemented in hardware calculating a polynomial approximating equations 2 and 3 above, or in a microcontroller.

In block 301, the frequency sweep is started by initializing the shift register 5 (cf. FIG. 1) by pushing deactivation ("0") bits into all bits of the shift register 5, so that none of the capacitors 6 are switched into the circuit, the oscillator outputting a signal with a first frequency $f_0$.

In block 302, on leading edge of the clock signal 10, after a time $\Delta T_0$, a first activation bit ("1") is pushed into the shift register, switching a first capacitor into the oscillator circuit, changing the oscillator frequency in a step-wise fashion to a second frequency $f_1$. The time $\Delta T_0$ is chosen so that the step in oscillator frequency $f_1 - f_0$ matches the desired time profile of the generated frequency sweep, so the step-wise oscillator frequency output matches the desired time profile of the generated frequency sweep.

Similarly, in block 302, after a further time $\Delta T_1$, a second activation bit ("1") is pushed into the shift register, switching a second capacitor into the oscillator circuit, so that two capacitors are now switched into the circuit, changing the oscillator frequency to a third frequency $f_2$, with the time $\Delta T_2$ similarly chosen so the step in oscillator frequency to $f_2$ matches the desired time profile. This is repeated in blocks 303, 304, and 305, until the shift register, in block 306, is filled with activation ("1") bits, corresponding to all capacitors being switched into the oscillator circuit.

The frequency sweep may then, optionally, be repeated by returning to block 301.

In this example, and contrary to the situation described in conjunction with FIG. 2, activation bits are pushed into the shift register, resulting in a downward sweep in oscillator frequency in the typical case of an inverse square root LC dependence of the oscillator frequency. However, the description is equally valid, mutatis mutandis, in the case of pushing deactivation bits into the shift register, such as depicted in FIG. 2. In the typical case of generating a linear frequency sweep, the times between clock signals $\Delta T_0$, $\Delta T_1$, $\Delta T_2$ . . . will successively get longer, corresponding to a decrease in clock signal frequency, in the case of pushing deactivation bits into the shift register and generating an upward linear frequency sweep (again, cf. FIG. 2), and successively shorter, corresponding to an increase in clock signal frequency, in the case of pushing activation bits into the shift register and generating a downward linear frequency sweep.

In the above the disclosure has mainly been described with reference to a limited number of examples. However, as is readily appreciated by a person skilled in the art, other examples than the ones disclosed above are equally possible within the scope of the disclosure, as defined by the appended claims.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. An inductor-capacitor oscillator configured to generate a signal with a frequency sweep, the inductor-capacitor oscillator having circuitry comprising:
    a set of capacitors, each capacitor of the set of capacitors being switchably connectable in parallel in the circuitry so that a frequency of the signal has an intrinsic dependence on a number of the capacitors connected, and wherein the circuitry comprises a tank circuit;
    a shift register controllable by a clock line and comprising a number of bits, each bit of the number of bits controlling connection of a respective capacitor of the set of capacitors so that the capacitors are connectable or disconnectable in a pre-determined order by shifting, respectively, activation or de-activation bits into the shift register, wherein the shifting is paced by the clock line;
    a clock signal generator configured to output a clock signal with a time modulation on the clock line; and
    a switch register embedded in the tank circuit.

2. The oscillator of claim 1, wherein the oscillator is configured to generate the frequency sweep with a specific time dependence, the time modulation being based on the specific time dependence of the frequency sweep in relation to the intrinsic dependence of the frequency of the signal on the number of capacitors connected, so that the oscillator generates the frequency sweep with the specific time dependence.

3. The oscillator of claim 2, wherein the specific time dependence of the frequency sweep is a linear ramp.

4. The oscillator of claim 1, wherein the frequency sweep is towards increasing frequency.

5. The oscillator of claim 1, wherein the signal is a radar signal.

6. The oscillator of claim 2, wherein the oscillator is configured to generate a time domain compensation allowing compensation for frequency non-linearity.

7. The oscillator of claim 6, wherein the time domain compensation is an inverse function of the square root of oscillator frequency non-linearity.

8. A method of generating a signal with a frequency sweep, the method comprising:
    shifting activation or de-activation bits into a shift register, the shift register comprising a number of bits, each bit of the number of bits controlling connection of a respective capacitor of a set of capacitors in parallel in circuitry of an inductor-capacitor oscillator, the circuitry comprising a tank circuit and a switch register embedded within the tank circuit, the capacitors being connected or disconnected in a pre-determined order by the shifting of the activation or deactivation bits, a frequency of the signal having an intrinsic dependence on the number of the capacitors connected, wherein the shifting is paced by a clock signal having a time modulation.

9. The method of claim 8, wherein the oscillator is configured to generate the frequency sweep with a specific time dependence, the time modulation being based on the specific time dependence of the frequency sweep in relation to the intrinsic dependence of the frequency of the signal on a number of capacitors connected, so that the oscillator generates the frequency sweep with the specific time dependence.

10. The method of claim 9, wherein the specific time dependence of the frequency sweep is a linear ramp.

11. The method of claim 8, wherein the frequency sweep is towards increasing frequency.

12. The method of claim 8, wherein the signal is a radar signal.

13. The method of claim 9, wherein the oscillator is configured to generate a time domain compensation allowing compensation for frequency non-linearity.

14. The method of claim 13, wherein the time domain compensation is an inverse function of the square root of oscillator frequency non-linearity.

* * * * *